US006842050B2

(12) United States Patent
Hastings et al.

(10) Patent No.: US 6,842,050 B2
(45) Date of Patent: Jan. 11, 2005

(54) CURRENT-MODE CIRCUIT FOR IMPLEMENTING THE MINIMUM FUNCTION

(75) Inventors: Roy Alan Hastings, Allen, TX (US); Lemuel Herbert Thompson, II, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/456,360

(22) Filed: Jun. 6, 2003

(65) Prior Publication Data

US 2004/0246029 A1 Dec. 9, 2004

(51) Int. Cl.[7] ................................................ G01R 19/00

(52) U.S. Cl. .............................. 327/58; 327/62; 327/60

(58) Field of Search .............................. 327/50, 53, 58, 327/60–63, 65, 66, 72, 78, 403–405, 407–413, 77; 323/312, 315

(56) References Cited

U.S. PATENT DOCUMENTS

| | | | | | |
|---|---|---|---|---|---|
| 5,446,397 | A | * | 8/1995 | Yotsuyanagi | 327/66 |
| 6,133,764 | A | * | 10/2000 | Griffith et al. | 327/65 |
| 6,198,312 | B1 | * | 3/2001 | Floyd | 327/77 |
| 6,492,845 | B1 | * | 12/2002 | Ge et al. | 327/53 |

* cited by examiner

*Primary Examiner*—Long Nguyen
(74) *Attorney, Agent, or Firm*—W. Daniel Swayze, Jr.; W. James Brady; Frederick J. Telecky, Jr.

(57) ABSTRACT

The present invention comprises a circuit consisting of four transistors (101–104) and an optional clamping Zener (107) arranged such that the current drawn through a load (120) is equal to the lesser of an input current (106) and a reference current (105).

20 Claims, 1 Drawing Sheet

CURRENT-MODE CIRCUIT FOR IMPLEMENTING THE MINIMUM FUNCTION

FIELD OF THE INVENTION

The present invention relates to circuits designed to provide an output signal proportional to a function of a plurality of inputs. More specifically, it relates to a circuit whose output current is proportional to the lesser of two input currents.

BACKGROUND OF THE INVENTION

There are a number of circuits and techniques for implementing minimum and maximum functions. One example, as seen in FIG. 1, uses a pair of operational amplifiers $OA_1$, and $OA_2$. As seen therein, the circuit receives input signals $X_1$ and $X_2$, both in the form of voltages, and produces output signal Y, a voltage that satisfies the function:

$$Y=\min(X_1, X_2)$$

This prior art circuit uses voltages rather than currents as its signals. This has the disadvantage of not interfacing to current-mode circuitry, such as Gilbert translinear circuits, without the addition of resistors. The op-amps are large, and consume significant amounts of current. The present invention comprises an improved circuit to implement the minimum function. It uses currents for both its input and output variables. The circuit is small and uses minimal current beyond that required to represent its input quantities.

SUMMARY OF THE INVENTION

The present invention achieves technical advantages as a circuit designed to implement the minimum function using a current-mode solution. More specifically, an exemplary embodiment of the present invention is implemented using a four-transistor MOS circuit that selects the smaller of two input currents. An exemplary embodiment of the present invention will output the minimum of two input signals, either the input current or the reference current, with less than three percent (3%) error. The circuit of the present invention is much smaller than conventional circuits that implement the minimum function, such as an op-amp implementation, and consumes minimal current beyond that representing the two inputs.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
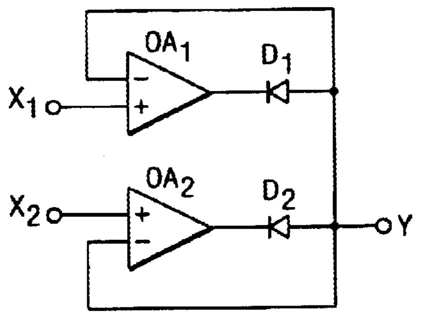
FIG. 1 (PRIOR ART)
FIG. 1 is a schematic diagram of a prior-art circuit for implementing a minimum function.

The numerous innovative teachings of the present invention will be described with particular reference to an exemplary embodiment. However, it should be understood that this exemplary embodiment-provides only one example of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 2:
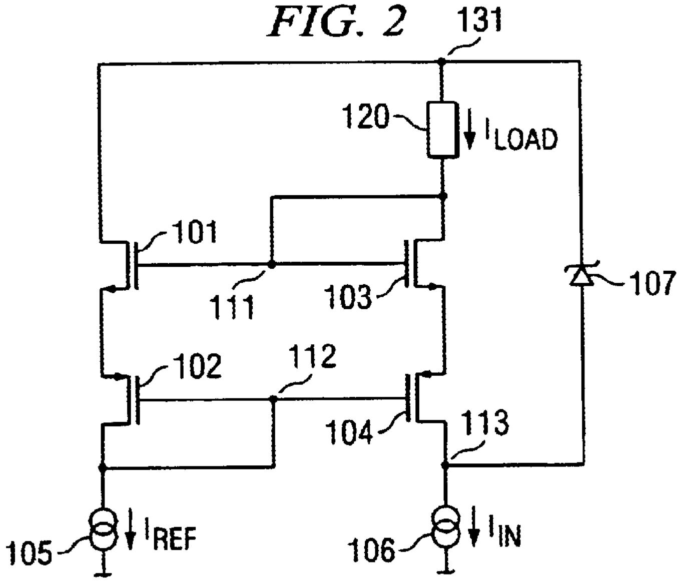
FIG. 2 is a schematic diagram of the present invention.

FIG. 2 illustrates an exemplary embodiment of the present invention. Assuming the dimensions of transistors 101 and 103 are equal, and likewise the dimensions of transistors 102 and 104 are equal, this circuit generates an output current $I_{LOAD}$ whose magnitude equals the lesser of input currents $I_{in}$ and $I_{ref}$:

$$I_{LOAD} = \min\begin{Bmatrix} I_{in} \\ I_{ref} \end{Bmatrix}$$

As exemplified in FIG. 2, the present invention comprises four transistors, 101, 102, 103, and 104 that are configured with a first current source $I_{ref}$ 105 and a second current source $I_{in}$ 106, load 120 and diode 107. Transistor 101 comprises an NMOS, transistor 102 comprises a PMOS, transistor 103 comprises an NMOS and transistor 104 comprises a PMOS. Diode 107 comprises a Zener diode or an avalanche diode. The transistors are arranged such that the drain of transistor 101 is coupled to a voltage source at a first voltage supply rail 131. The source of transistor 101 is coupled to the source of transistor 102. The drain of transistor 102 is coupled to first current source 105. The gates of transistors 101 and 103 are coupled at node 111, the gate of transistor 103 also being coupled to the drain of transistor 103. The gates of transistors 102 and 104 are coupled at node 112, the gate of transistor 102 also being coupled to the drain of transistor 102. A first terminal of load 120 is coupled to voltage supply rail 131 and a second terminal of load 120 is coupled to the drain of transistor 103. The source of transistor 103 is coupled to the source of transistor 104. The drain of transistor 104 is coupled to second current source $I_{in}$ 106. The anode of diode 107 is coupled to the drain of transistor 104 at node 113 and the cathode of diode 107 is coupled to voltage supply rail 131.

The behavior of transistors 101, 102, 103 and 104 can be explained in terms of the Shichman-Hodges equations (see D. A. Hodges and H. G. Jackson, *Analysis and Design of Digital Integrated Circuits* (McGraw-Hill, NY: 1983), p. 51):

$$I_d = k\left[(V_{gs}-V_t)V_{ds} + \frac{V_{ds}^2}{2}\right]\text{for } V_{gs} \geq V_t,\ V_{ds} \leq (V_{gs}-V_t) \quad [1]$$

$$I_d = \frac{k}{2}(V_{gs}-V_t)^2\text{for } V_{gs} \geq V_t,\ V_{ds} > (V_{gs}-V_t) \quad [2]$$

Equation [1] describes the linear region of operation, and equation [2] describes the saturation region of operation. The transconductance k can be described in terms of a process transductance k' as:

$$k = k'\frac{W}{L} \quad [3]$$

Rearranging equation [2] gives a formula for $V_{gs}$ in saturation:

$$V_{gs} = \sqrt{\frac{2I_d}{k}} + V_t \text{ for } V_{gs} \geq V_t,\ V_{ds} > (V_{gs} - V_t) \quad [4]$$

Referring to the circuit of FIG. 2, current $I_{ref}$ pulls down node 112 and load 120 pulls up node 111 until transistors 101 and 102 are biased into saturation. Then:

$$V_{111} - V_{112} = V_{gs101} + V_{gs102} = \sqrt{\frac{2I_{d101}}{k_{101}}} + V_{t101} + \sqrt{\frac{2I_{d102}}{k_{102}}} + V_{t102} \quad [5]$$

Since $I_{d101}=I_{d102}=I_{ref}$ this simplifies to $$V_{111} - V_{112} = \sqrt{\frac{2I_{ref}}{k_{101}}} + \sqrt{\frac{2I_{ref}}{k_{102}}} + V_{t101} + V_{t102} \quad [6]$$

Now voltage $V_{111}-V_{112}$ is imposed across transistors 103 and 104, biasing them into conduction. Presuming that both transistors are in saturation, $$V_{111} - V_{112} = V_{gs103} + V_{gs104} = \sqrt{\frac{2I_{d103}}{k_{103}}} + V_{t103} + \sqrt{\frac{2I_{d104}}{k_{104}}} + V_{t104} \quad [7]$$

Since $I_{d103}=I_{d104}=I_{LOAD}$, this simplifies to:

$$V_{111} - V_{112} = \sqrt{\frac{2I_{LOAD}}{k_{103}}} + V_{t103} + \sqrt{\frac{2I_{LOAD}}{k_{104}}} + V_{t104} \quad [8]$$

Setting [6] equal to [8] gives:

$$\sqrt{\frac{2I_{ref}}{k_{101}}} + \sqrt{\frac{2I_{ref}}{k_{102}}} + V_{t101} + V_{t102} = \sqrt{\frac{2I_{LOAD}}{k_{103}}} + \sqrt{\frac{2I_{LOAD}}{k_{104}}} + V_{t103} + V_{t104} \quad [9]$$

Now, $V_{t101}$ and $V_{t103}$ are threshold voltages of NMOS transistors on a common die and are thus substantially equal. Similarly, $V_{t102}$ and $V_{t104}$ are substantially equal. Further substituting in equation [3] and assigning process transductances of $k_n'$ and $k_p'$ to NMOS and PMOS transistors, respectively, the following is obtained:

$$\sqrt{\frac{I_{ref}}{k_n\left(\frac{W}{L}\right)_{101}}} + \sqrt{\frac{I_{ref}}{k_p\left(\frac{W}{L}\right)_{102}}} = \sqrt{\frac{I_{LOAD}}{k_n\left(\frac{W}{L}\right)_{103}}} + \sqrt{\frac{I_{LOAD}}{k_p\left(\frac{W}{L}\right)_{104}}} \quad [10]$$

Extracting $I_{ref}$ and $I_{LOAD}$, $$I_{ref}\left(\sqrt{\frac{1}{k_n\left(\frac{W}{L}\right)_{101}}} + \sqrt{\frac{1}{k_p\left(\frac{W}{L}\right)_{102}}}\right)^2 = I_{LOAD}\left(\sqrt{\frac{1}{k_n\left(\frac{W}{L}\right)_{103}}} + \sqrt{\frac{1}{k_p\left(\frac{W}{L}\right)_{104}}}\right)^2 \quad [11]$$

If $$\left(\frac{W}{L}\right)_{101} = \left(\frac{W}{L}\right)_{103} \text{ and } \left(\frac{W}{L}\right)_{102} = \left(\frac{W}{L}\right)_{104},$$

then equation [11] reduces to:

$$I_{ref}=I_{LOAD} \quad [12]$$

Now, the conditions that lead to equation [12] will apply if the drain voltage of transistor 104 is sufficiently low to allow saturation. This will occur if $I_{in}$ is larger than $I_{d104}$, as current source $I_{in}$ will then draw node 113 down until diode 107 is biased into reverse conduction. This will not occur if $I_{in}$ is less than $I_{d104}$, as node 113 will move up until transistor 104 is forced back into triode, thus forcing a redistribution of $V_{gs}$'s between transistors 103 and 104. The nature of this redistribution need not be analyzed in detail since now $I_{d104}=I_{in}$ and thus $I_{LOAD}=I_{in}$.

Combining the above statements:

$$I_{LOAD}=I_{ref} \text{ if } I_{in}>I_{ref} \quad [139]$$

$$I_{LOAD}=I_{in} \text{ if } I_{in}\leqq I_{ref} \quad [136]$$

These can be further simplified to:

$$I_{LOAD}=\min(I_{in}, I_{ref}) \quad [14]$$

This analysis can be generalized to a case where $$\left(\frac{W}{L}\right)_{103} = N\left(\frac{W}{L}\right)_{101}$$

and $$\left(\frac{W}{L}\right)_{104} = N\left(\frac{W}{L}\right)_{102},$$

where N is any arbitrary positive number.

From equation [11], $$I_{ref}\left(\sqrt{\frac{1}{k_n\left(\frac{W}{L}\right)_{101}}} + \sqrt{\frac{1}{k_p\left(\frac{W}{L}\right)_{102}}}\right)^2 = I_{LOAD}\left(\sqrt{\frac{1}{k_n\left(\frac{W}{L}\right)_{101}N}} + \sqrt{\frac{1}{k_p\left(\frac{W}{L}\right)_{102}N}}\right)^2 \quad [15]$$

$$I_{ref} = I_{LOAD}\left(\frac{1}{\sqrt{N}}\right)^2 \quad [16]$$

$$I_{LOAD}=NI_{ref} \quad [17]$$

This case then gives the minimum function $$I_{LOAD}=\min(I_{in}, NI_{ref}) \quad [18]$$

Figure 3:
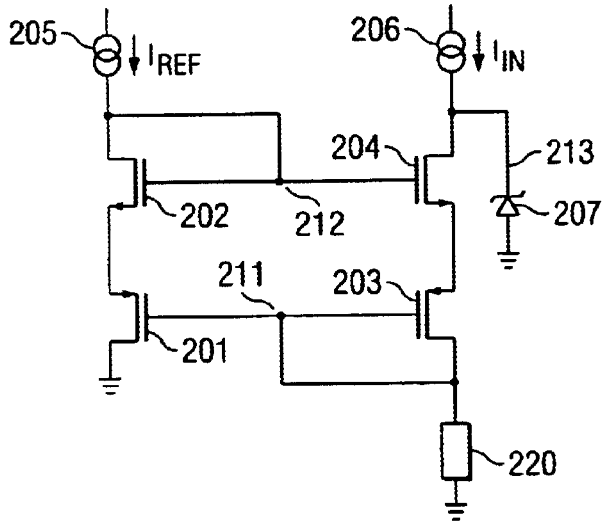
FIG. 3 is a schematic of an alternative implementation of the present invention.

FIG. 3 illustrates another implementation of the invention. Transistor 201 comprises a PMOS, transistor 202 comprises an NMOS, transistor 203 comprises a PMOS, and transistor 204 comprises an NMOS. Diode 207 comprises a Zener diode or an avalanche diode. The transistors are arranged such that the drain of transistor 201 is connected to a voltage potential, illustrated as ground. The source of transistor 201 is coupled to the source of transistor 202. The drain of transistor 202 is coupled to first current source $I_{ref}$ 205. The gates of transistors 201 and 203 are coupled at node 211, the gate of transistor 203 also being coupled to the drain of transistor 203. The gates of transistors 202 and 204 are coupled at node 212, the gate of transistor 202 also being coupled to the drain of transistor 202. A first terminal of load 220 is coupled to ground and a second terminal of load 220 is coupled to the drain of transistor 203. The source of transistor 203 is coupled to the source of transistor 204. The drain of transistor 204 is coupled to second current source $I_{in}$ 206. The anode of diode 207 is coupled to ground and the cathode of diode 207 is coupled to the drain of transistor 204 at node 213.

The circuit of FIG. 3 operates identically to the circuit of FIG. 2 except as follows: load 220 is coupled to ground instead of to a positive supply, and current sources 205 and 206 source current into the circuit rather than sink current out of the circuit.

The circuits of FIGS. 2 and 3 include a Zener diode or avalanche diode 107, 207. The purpose of this diode is to clamp the drain-to-source voltage across the input transistor 104, 204. If the voltages in the application circuit are sufficiently low so as to pose no risk to the input transistor, the diode may be omitted.

In some cases, the circuit of FIG. 2 could be modified by replacing NMOS transistors 101, 103 with bipolar NPN transistors. This change makes no essential alteration in the performance of the circuit. Likewise, PMOS transistors 201, 203 in FIG. 3 could be replaced with bipolar PNP transistors without essentially altering the performance of the circuit.

The present invention has a number advantages over conventional circuits implementing the minimum function, such as the operational amplifier circuit of FIG. 1. One of the advantages of the circuit of the present invention is that it operates on low current. The circuit requires only the currents representing the input quantities, $I_{ref}$ and $I_{in}$. Since no additional current is required, the circuit consumes the absolute minimum amount of current consistent with a current-mode implementation. Secondly, it is a simple circuit, having approximately five (5) components in it. And thirdly, the accuracy of the circuit is not limited by the voltage developed across the load. Assuming no losses due to hot carrier injection or junction leakage, when $I_{in}<I_{ref}$, the output current $I_{LOAD}$ will exactly track the input current $I_{in}$, regardless of any mismatches in the MOS transistors.

The exemplary embodiment of the present invention addresses many of the shortcomings of the prior art. The present invention may be described herein in terms of various functional components. It should be appreciated that such functional components may be realized by any number of hardware or structural components configured to perform the specified functions. For example, the present invention may employ various integrated components which are comprised of various electrical devices, such as resistors, transistors, capacitors, diodes and the like whose values may be suitably configured for various intended purposes. Additionally, the various components may be implemented in alternate ways, such as, for example, the changing of transistor devices from PMOS to NMOS transistors, or by the omission of the diode. These alternatives can be suitably selected depending upon the particular application or in consideration of any number of factors associated with the operation of the system. Such general applications that may be appreciated by those skilled in the art in light of the present disclosure are not described in detail herein. Further, it should be noted that while various components may be suitably coupled or connected to other components within the exemplary circuit, such connections and couplings can be realized either by direct connection between components, or by connection through other components and devices located there between. These and other changes or modifications are intended to be included within the scope of the present invention, as expressed in the following claims.

What is claimed is:

1. A circuit for implementing the minimum function of two quantities, comprising:

a first voltage rail;

a first transistor having a first gate, a first source, and a first drain coupled to the first voltage rail;

a second transistor having a second drain coupled to a second gate and coupled to the first gate of the first transistor, and a second source;

a load coupled to the first voltage rail and to the second drain of the second transistor;

a third transistor having a third drain coupled to a first input to represent a first quantity, a third gate, and a third source coupled to the second source of the second transistor; and a fourth transistor having a fourth drain coupled to a fourth gate and coupled to the third gate of the third transistor and coupled to a second input to represent a second quantity, and a fourth source coupled to the first source of the first transistor.

2. The circuit of claim 1, further comprising a voltage-clamping element with a first terminal coupled to the first voltage rail and a second terminal coupled to the first input to operate so as to limit the voltage between the first input and the first voltage rail to a predetermined value.

3. The circuit of claim 2, wherein said voltage-clamping element comprises a Zener diode.

4. The circuit of claim 2, wherein said voltage-clamping element comprises an avalanche diode.

5. The circuit of claim 2, wherein said voltage-clamping element comprises a transistor.

6. The circuit of claim 1, wherein the first transistor and the second transistor comprise PMOS transistors, and the third transistor and the fourth transistor comprise NMOS transistors.

7. The circuit of claim 1, wherein the first transistor and the second transistor comprise NMOS transistors, and the third transistor and the fourth transistor comprise PMOS transistors.

8. The circuit of claim 1, wherein the first to fourth transistors have identical width-to-length ratios.

9. The circuit of claim 1, wherein the first transistor's width-to-length ratio is a multiple of the second transistor's width-to-length ratio and the fourth transistor's width-to-length ratio is the same multiple of the third transistor's width-to-length ratio.

10. The circuit of claim 1, wherein said circuit is implemented in an integrated circuit.

11. A method of selecting the lesser of two quantities, comprising:

providing a first voltage rail;

providing a first transistor having a first drain coupled to the first voltage rail, a first gate, and a first source;

providing a second transistor having a second drain coupled to a second gate and coupled to the first gate of the first transistor, and a second source;

providing a third transistor having a third drain, a third gate, and a third source coupled to the second source of the second transistor;

providing a fourth transistor having a fourth drain coupled to a fourth gate and coupled to the third gate of the third transistor; and a fourth source coupled to the first source of the first transistor;

providing a first current source representing a first quantity coupled to the third drain of the third transistor;

providing a second current source representing a second quantity coupled to the fourth drain of the fourth transistor; and providing a load coupled to the second drain of the second transistor, the current through said load being proportional to the lesser of the first quantity and the second quantity.

12. The method of selecting the lesser of two quantities of claim 11, further comprising the step of providing a voltage-clamping element with a first terminal coupled to the first voltage rail and a second terminal coupled to the first input terminal operable so as to limit the voltage between the third drain of the third transistor and the first voltage rail to a predetermined value.

13. The method of selecting the lesser of two quantities of claim 12, wherein the voltage-clamping element comprises a Zener diode.

14. The method of selecting the lesser of two quantities of claim 12, wherein the voltage-clamping element comprises an avalanche diode.

15. The method of selecting the lesser of two quantities of claim 12, wherein the voltage-clamping element comprises a transistor.

16. The method of selecting the lesser of two quantities of claim 11, wherein the first transistor and the second transistor comprise PMOS transistors, and the third transistor and the fourth transistor comprise NMOS transistors.

17. The method of selecting the lesser of two quantities of claim 11, wherein the first transistor and the second transistor comprise NMOS transistors, and the third transistor and the fourth transistor comprise PMOS transistors.

18. The method of selecting the lesser of two quantities of claim 11, wherein the four transistors have identical width-to-length ratios.

19. The method of selecting the lesser of two quantities of claim 11, wherein the first transistor's width-to-length ratio is a multiple of the second transistor's width-to-length ratio, and the fourth transistor's width-to-length ratio is the same multiple of the third transistor's width-to-length ratio.

20. The method of selecting the lesser of two quantities of claim 11, further comprising being implemented in an integrated circuit.

* * * * *